US005475390A

United States Patent [19]

Morikawa et al.

[11] Patent Number: 5,475,390

[45] **Date of Patent: * Dec. 12, 1995**

[54] TONE INFORMATION PROCESSING DEVICE FOR AN ELECTRONIC MUSICAL INSTRUMENT

[75] Inventors: Shigenori Morikawa; Kohtaro Hanzawa; Hiroyuki Sasaki; Hiroshi Morokuma, all of Tokyo, Japan

[73] Assignee: Casio Computer Co., Ltd., Tokyo, Japan

[ * ] Notice: The portion of the term of this patent subsequent to Jul. 21, 2004, has been disclaimed.

[21] Appl. No.: 263,007

[22] Filed: Jun. 20, 1994

Related U.S. Application Data

[60] Continuation of Ser. No. 927,202, Aug. 7, 1992, abandoned, which is a division of Ser. No. 607,446, Oct. 31, 1990, Pat. No. 5,160,798, which is a division of Ser. No. 388,720, Jul. 31, 1989, Pat. No. 4,970,935, which is a continuation of Ser. No. 72,221, Jul. 10, 1987, abandoned, which is a continuation of Ser. No. 760,290, Jul. 29, 1985, Pat. No. 4,681,008.

[30] Foreign Application Priority Data

Aug. 9, 1984 [JP] Japan .................................. 59-167120

[51] Int. Cl.[6] ............................ G09B 15/02; H03M 1/00

[52] U.S. Cl. ......................... 341/122; 84/477 R; 341/123

[58] Field of Search ......................... 84/603–607, 477 R, 84/478; 341/110, 122–125; 360/32

[56] References Cited

U.S. PATENT DOCUMENTS

| | | | |
|---|---|---|---|
| 4,067,253 | 1/1978 | Wheelwright et al. . | |
| 4,138,915 | 2/1979 | Nagai et al. . | |
| 4,279,185 | 7/1981 | Alonso | 84/603 |

(List continued on next page.)

FOREIGN PATENT DOCUMENTS

| | | |
|---|---|---|
| 3330715A1 | 3/1982 | Germany . |
| 3146000A1 | 7/1982 | Germany . |
| 2830483C2 | 11/1982 | Germany . |
| 59-109090 | 6/1959 | Japan . |
| 57-31156 | 7/1972 | Japan . |
| 51-78219 | 7/1976 | Japan . |
| 54-161313 | 12/1979 | Japan . |
| 55-28072 | 2/1980 | Japan . |
| 55-12542 | 4/1980 | Japan . |
| 55-16698 | 12/1980 | Japan . |
| 57-155594 | 9/1982 | Japan . |
| 60-3892 | 1/1985 | Japan . |
| 61-9693 | 1/1986 | Japan . |
| 61-6689 | 1/1986 | Japan . |
| 61-18996 | 1/1986 | Japan . |
| 61-112193 | 5/1986 | Japan . |
| 61-248096 | 11/1986 | Japan . |
| 61-292688 | 12/1986 | Japan . |
| 1-17158 | 3/1989 | Japan . |

*Primary Examiner*—Stanley J. Witkowski

*Attorney, Agent, or Firm*—Frishauf, Holtz, Goodman & Woodward

[57] ABSTRACT

An electronic musical instrument comprises a tone generator for generating a plurality of different digital waveform signals corresponding to different timbres, and a device for setting a plurality of ranges defined by two parameters, a first one of the parameters being a pitch parameter and a second one of the parameters being a key touch parameter. The parameters vary according to the musical performance, and a range for the pitch parameter in combination with a range for the key touch parameter respectively designating one of the plurality of different digital waveform signals having different timbres. An input device is provided for inputting the two parameters according to a musical performance. A judging device judges a respective range to which each of the inputted two parameters belongs, and a selector selects one of the plurality of digital waveform signals from the setting device corresponding to a judged result to generate one of the plurality of different digital waveform signals from the tone generator, the plurality of different digital waveform signals thereby being selectively generated in order to output a sound having a corresponding timbre in response to the two parameters thus inputted.

8 Claims, 9 Drawing Sheets

U.S. PATENT DOCUMENTS 4,305,319 12/1981 Linn .
4,383,462 5/1983 Nagai et al. .
4,392,405 7/1983 Franz et al. .............................. 84/603
4,392,409 7/1983 Coad, Jr. et al. ..................... 84/477 X
4,442,745 4/1984 Gross et al. .
4,461,199 7/1984 Hiyoshi et al. .
4,463,650 8/1984 Rupert .
4,464,968 8/1984 Onoye ...................................... 84/603
4,484,506 11/1984 Sato ...................................... 84/477 X
4,502,361 3/1985 Viitanen et al. .
4,506,581 3/1985 Sunada .
4,520,706 6/1985 Deforeit .
4,539,884 9/1985 Aoki .
4,561,337 12/1985 Wacht .
4,596,032 6/1986 Sakurai ................................ 84/603 X
4,614,983 9/1986 Usami .
4,618,851 10/1986 Watanabe .
4,622,878 11/1986 Sharp .
4,632,001 12/1986 Suzuki ...................................... 84/603
4,667,556 5/1987 Hanzawa et al. .
4,681,007 7/1987 Nikaido et al. .
4,696,214 9/1987 Ichiki .

TONE INFORMATION PROCESSING DEVICE FOR AN ELECTRONIC MUSICAL INSTRUMENT

This application is a continuation of application Ser. No. 07/927,202, filed Aug. 7, 1992 (now abandoned), which is a divisional of application Ser. No. 07/607,446 filed Oct. 31, 1990 (now U.S. Pat. No. 5,160,798), which is a divisional of application Ser. No. 07/388,720 filed Jul. 31, 1989 (now U.S. Pat. No. 4,970,935), which is a continuation of application Ser. No. 07/072,221 filed Jul. 10, 1987 (now abandoned), which is a continuation of application Ser. No. 06/760,290, filed Jul. 29, 1985 (now U.S. Pat. No. 4,681, 008).

BACKGROUND OF THE INVENTION

This invention relates to a tone information processing device for an electronic musical instrument of the type in which a digital signal obtained through conversion of an externally supplied acoustic or sound signal is stored in a memory to be used as a sound source signal for forming a tone signal.

Heretofore, various electronic musical instruments have been provided, in which an externally supplied sound signal representing a musical sound of a piano, violin, etc. or bird's chirping, etc. is stored in a memory after conversion to a digital signal based on a PCM system or the like and the stored signal is read out of the memory to be utilized as a sound source signal of a keyboard electronic musical instrument or the Like. In such an electronic musical instrument, the external sound signal to be stored in the memory is digitized through sampling at a given frequency. Therefore, the stored waveform does not start at a zero crossing point and end at a zero crossing point. For this reason, a tone formed by reading out the stored signal from the memory may contain clicks or similar noise.

Further, there may be cases when external sounds having different pitches are stored together in a memory. In such a case, if these external sounds are written in and read out from the memory at a fixed sampling frequency and at a fixed address designation rate, the tone pitch varies with different external sounds, i.e., tones can not be played back at a correct pitch.

Further, in the prior art electronic musical instrument noted above, tones are formed by merely reading out the recorded external sounds. Therefore, the tones formed are rather poor in variations. In addition, the original sound of the tone formed can not be identified. At any rate, the status of playback obtained is rather monotonous.

SUMMARY OF THE INVENTION

An object of the invention is to provide, an electronic musical instrument overcoming the above drawbacks.

Some of the aspects of the present invention are summarized below.

According to a first aspect of the present invention, a tone information processing device, comprises first converting means for converting an analog external sound waveform signal into a digital waveform signal which represents a waveform corresponding to a waveform of said external sound waveform signal; memory means for recording said digital waveform signal as outputted from said first converting means; reading and writing means for reading out said digital waveform signal recorded in said memory means at a speed corresponding to a designated tone frequency in a play mode and for writing said digital waveform signal obtained by the first converting means into said memory means at a sampling rate in a record mode; second converting means for converting the digital waveform signal read out from said memory means into an analog sound signal which has the waveform determined by said digital waveform signal; tone frequency designating means coupled to said reading means for designating a frequency of the sound produced based on the analog sound signal derived from said first converting means; and determining means coupled to said memory means and said reading means for determining start and end addresses of reading of said digital waveform signal recorded in said memory means in relation to the waveform of said digital waveform signal; and wherein said reading and writing means includes waveform read/write controller means coupled to said memory means, and which has a multiple channel structure for providing address signals to said memory means on a time division basis, each channel of said multiple channel structure being capable of providing respective reading address signals corresponding to the designated frequency in a play mode, and at least one channel of said multiple channel structure providing writing address signals changing at said sampling rate in the record mode.

According to another aspect of the invention, a one information processing device comprises first converting means for converting an external sound waveform signal into a digital waveform signal; record memory means for recording said digital waveform signal; reading means for reading out said digital waveform signal recorded in said record memory means at a determined frequency; second converting means for converting the digital waveform signal read out from said record memory means into an analog sound signal which has a waveform determined by said digital waveform signal; and allotment designating means coupled to said reading means for designating an allotment of a particular note to the frequency of said sound waveform signal recorded in said record memory mean; wherein said reading means includes means for reading out the digital waveform signal from said record memory means at a frequency which is determined by the particular note allotted by said allotment means and also a designated note corresponding to a sequence of a musical performance.

According to yet another aspect of the present invention, a tone information processing device comprises converting means for converting an analog waveform signal into a digital signal; record memory means for recording said digital signal representing the waveform of the analog waveform signal; control means for controlling recording of said digital signal in said record memory means in a record mode and for reading out and converting the recorded digital signal into a sound signal having a designated frequency in a play mode; said control means includes setting means for setting start and end addresses for reading of said digital signal recorded in said record memory means at zero crossing points of said waveform signal; wherein said address setting means includes incrementing means for incrementing a designated address of said record memory means, detecting means for detecting the polarity of the value of the digital signal in the designated address according to the increment of the designated address, comparing means for comparing the value of the digital signal with a predetermined value when a change in the polarity of the digital signal is detected by said detecting means, and storing means for storing as said start and end addresses of the record memory means addresses corresponding to values of the waveform when the waveform values are smaller than said predetermined value as compared by said comparing means; and said control means further includes waveform read/write controller means coupled to said record memory means, said waveform read/write controller means having a plurality of channels, each of said channels providing address signals to said record memory means on a time division basis, and each of said channels being capable of providing respective reading address signals corresponding to the designated frequency in the play mode, and at least one of said channels providing writing address signals changing at a sampling rate in the record mode.

According to yet another aspect of the present invention, a tone information processing device comprises analog-to-digital converting means for converting an external sound waveform signal into a digital waveform signal; memory means for recording said digital waveform signal; reading means for reading out said digital waveform signal recorded in said memory means at a frequency corresponding to a note frequency; and allotment designating means for allotting a particular note to the frequency of said converted external sound waveform; wherein said reading means includes means for reading out said digital waveform signal from said memory means at a frequency which is predetermined by the particular note allotted by said allotment designating means and the designated note according to sequence of a musical performance.

According to yet another aspect of the present invention a sampling apparatus, comprises converting means for converting a waveform signal into a digital signal; record memory means for recording said digital signal representing the waveform; display means for displaying a memory state of said record memory means; designating means for manually designating a portion of the digital signal stored in said record memory means while a user can see the memory state of said record memory means by said display means; and deleting means for deleting the portion of the digital signal designated by said designating means from the record memory means.

According to yet another aspect of the present invention, a sampling apparatus, comprises analog-to-digital converting means for converting an external sound waveform signal to a digital waveform signal; memory means having a plurality of storage blocks each having a plurality of addresses;storage block designating means for designating at least one storage block of said memory means to store the digital waveform signal; read/write control means coupled to said memory means and having means for storing the digital waveform signal into the addresses in the storage block designated by said storage block designating means at a predetermined rate, and means for reading out the digital waveform signal from the addresses in at least one of the storage blocks at a designated rate which differs from the predetermined rate; and digital-to-analog converting means coupled to said memory means for converting the digital waveform signal read out from the memory means into an analog sound waveform signal which has a wave shape determined by said digital waveform signal.

DETAILED DESCRIPTION OF THE PREFERRED EMBODIMENTS

Figure 1:
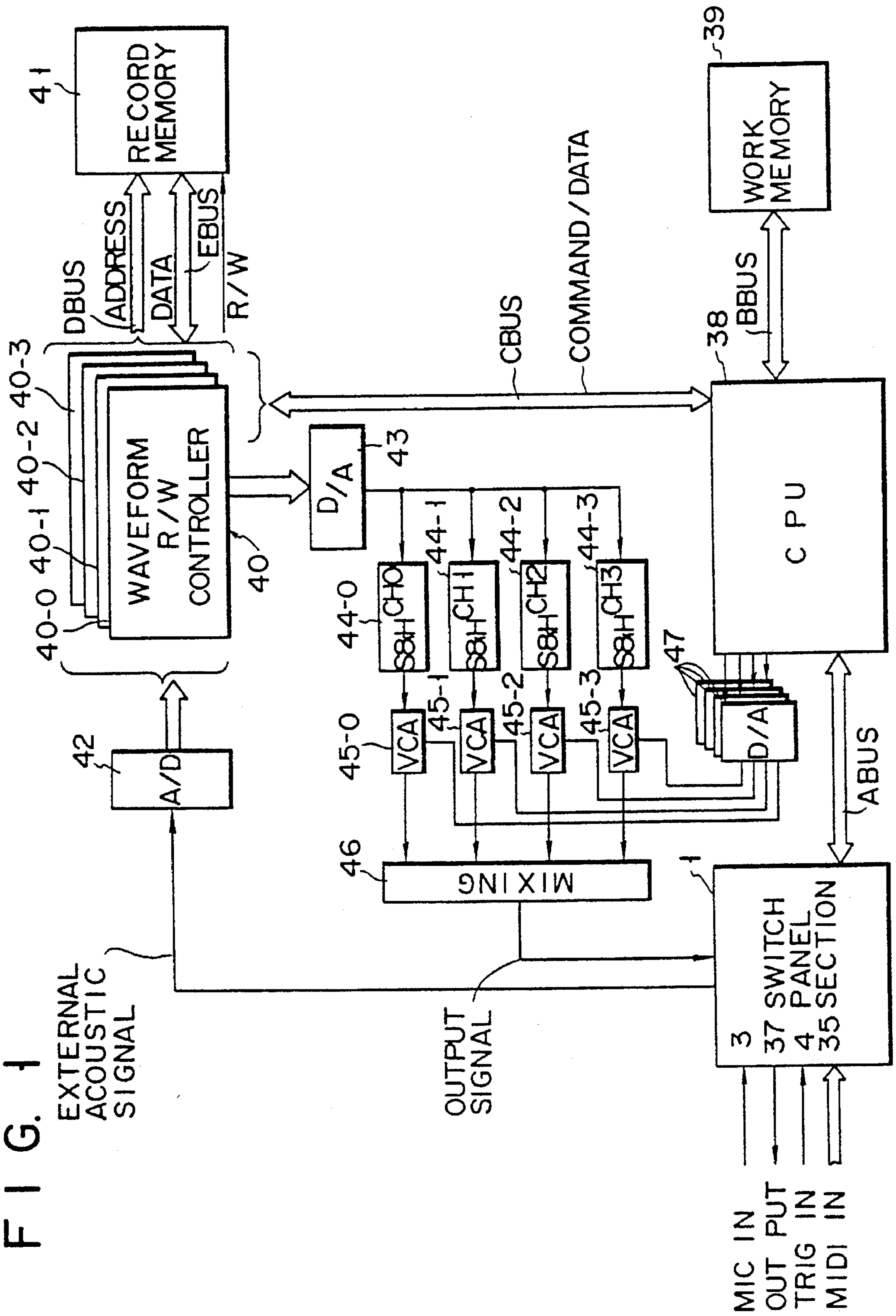
FIG. 1 is a block diagram showing an embodiment of the invention.

Now, an embodiment of the invention will be described in detail with reference to the drawings. FIG. 1 shows an embodiment of the device according to the invention. The device comprises an operating switch panel section 1 which includes terminals for transfer of signals to and from the outside, all operation switches for controlling the operation of the device and a display device.

Figure 2:
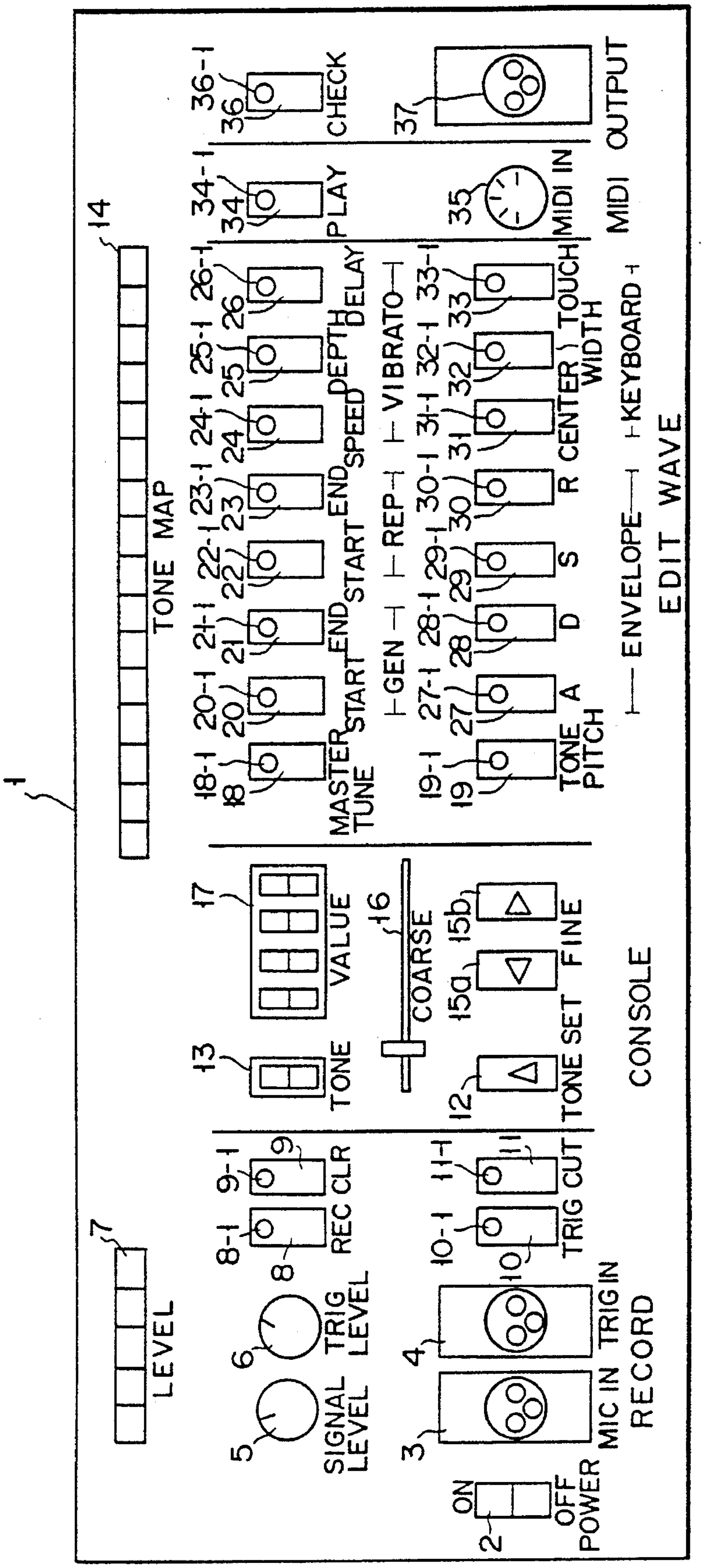
FIG. 2 is a plan view showing an operating switch panel section shown in FIG. 1.

FIG. 2 shows the operating switch panel section 1 in detail. As is shown, the section includes a power switch 2 for turning on and off power supplied to the entire device. A microphone plug can be inserted into a MIC IN terminal 3 for coupling external sound signals. A TRIGGER IN terminal 4 is provided adjacent to the MIC IN terminal 3., A trigger signal is externally supplied through the terminal 4 as a command for starting the recording of an external sound signal supplied through the MIC IN terminal 3. Although no keyboard is shown in FIG. 1, signal from a keyboard of an electronic musical instrument (not shown) connected to a MIDI (musical instrument digital interface) through a MIDI IN terminal 35 or control signal or data from a personal computer connected to the MIDI is used. A tone signal which is formed inside the device of this embodiment is also supplied to the MIDI through an output terminal 37 provided on the panel 1 to be sounded through a given sounding system.

A record (RECORD) section on the panel 1 shown in FIG. 2 includes a signal level volume control 5 for controlling the level of a sound signal externally supplied through the MIC IN terminal 3, a trigger level volume control 6 for setting a trigger level, i.e., a level of automatic start of recording of the sound signal externally supplied to the MIC IN terminal 3 and a level meter 7. The level meter 7 consists of five LEDs arranged in a row and displays a signal level as a bar graph display consisting of a corresponding number of "on" LEDs.

The record section further includes a record (REC) switch 8 for setting up a record mode, a clear (CLR) switch 9 for clearing recorded signals, a trigger (TRIG) switch 10 operable by a player for manually coupling a trigger signal, and a cut (CUT) switch 11 for erasing unnecessary portion of the recorded signal. These switches 8 to 11 respectively have inner LEDs 8-1 to 11-1 for displaying their operating state.

A console (CONSOLE) section on the panel 1 includes a tone set switch 12 which is operable for distinguishing a plurality of tones recorded in recording areas or blocks of a single recording memory from one another as will be described later. The tone number of each tone is displayed on a tone LED display 13 having segments arranged in figure "8" configuration, and the position and length of the pertinent recording area of the memory are displayed by bar graph display on a tone map LED display 14. The tone map LED display 14 has display elements corresponding in number to the number of memory blocks of recording memory to be described later. The tone number is increased every time the tone set switch 12 is operated.

The console section further includes fine (FINE) switches 15*a* and 15*b* and a coarse (COARSE) control 16 which are operated for coupling various parameters. According to the operation of the switches 15*a* and 15*b* and control 16, the display on a four-digit value (VALUE) LED display 17 having segments arranged in figure "8" configuration or on the tone map LED display 14 noted above is changed.

The fine switches 15*a* and 15*b* display a slight change in one operation. The switch 15*a* displays a direction of increase of parameter, and the switch 15*b* a direction of decrease. As the switches 15*a* and 15*b* are held depressed, the values are changed continuously. The coarse control 16 is operated for greatly varying parameter.

An edit wave (EDIT WAVE) section on the panel 1 has a plurality of switches for providing signals mainly for the way of use or correction of stored waveform signals. Of these switches a master tune (MASTER TUNE) switch 18 is for varying the pitch (i.e., frequency) of all the tones. When the switch 18 is operated, an inner LED 18-1 is turned on. Then, the actual frequency is set by operating the fine switches 15*a* and 15*b* and coarse control 16. Pertinent display at this time is done on the value LED display 17; for instance, a value representing a frequency is digitally displayed for tuning.

A tone pitch (TONE PITCH) switch 19 becomes effective when a plurality of different externally supplied tones are recorded, and it determines a pitch for each recorded tone. It is operable in the same way as the master tune switch 18, and when its inner LED 19-1 is turned on as it is operated once, the fine switches 15*a* and 15*b* and a coarse control 16 are operated. The frequency at this time is also digitally displayed on the value LED display 17.

General (GENERAL) start (START) and end (END) switches 20 and 21 in the edit wave section are for designating a start address and an end address, respectively, of a memory for obtaining a waveform generated as a tone. When their inner LEDs 20-1 and 21-1 are "on", the fine switches 15*a* and 15*b* and coarse control 16 are operated. The memory block is displayed on the tone map LED display 14, and the address is displayed on the value LED display 17.

Repeat (REPEAT) start (START) and end (END) switches 22 and 23 are for designating a start address and an end address, respectively, of a loop portion of a stored waveform which is to be read out repeatedly. When their inner LEDs 22-1 and 23-1 are "on", the fine switches 15*a* and 15*b* and coarse control 16 are operated for designating the address and block. Again, the block is displayed on the tone map LED display 14, and the address is displayed on the value LED display 17.

Vibrato (VIBRATO) speed (SPEED), depth (DEPTH) and delay (DELAY) switches 24, 25 and 26 in the edit wave section are for determining the speed, depth and delay time, respectively, of vibrato. When these switches are operated, their inner LEDs 24-1, 25-1 and 26-1 are turned on, and in this state the fine switches 15*a* and 15*b* and coarse control 16 are operated to couple the individual parameters. The parameter coupled is digitally displayed on the value LED display 17.

In this embodiment, it is possible to provide an envelope which is different from the envelope of a recorded waveform. Switches 27, 28, 29 and 30 are for setting modes of coupling the attack (A) time, decay (D) time, sustain (S) level and release (R) time, respectively, of a desired envelope. With the operation of these switches, their inner LEDs 27-1, 28-1, 29-1 and 30-1 are turned on, and in this state the individual parameters can be coupled digitally by operating the fine switches 15*a* and 15*b* and coarse control 16. Each coupled parameter is displayed on the value LED display 17.

In this embodiment, the relation between the keyboard of the keyboard musical instrument connected and output tone is variable. A center (CENTER) switch 31 determines a position (note) of keyboard corresponding to recorded external sound, a width (WIDTH) switch 32 determines a range or a width of a portion of the keyboard corresponding to the sound, and a touch (TOUCH) switch 33 determines a range of the sound according to a key touch (i.e., key depression speed). When the switches 31, 32 and 33 are operated, their inner LEDs 31-1, 32-1 and 33-1 are turned on. In this state, the fine switches 15*a*, 15*b* and coarse control 16 are operated.

More specifically, when the center switch 31 is operated, the value corresponding to a note is digitally displayed on the value LED display 17 with the operation of the fine switches 15*a* and 15*b* and coarse control 16. When the width switch 32 is operated, the upper or lower limit of the note to which the sound is allotted is displayed as a four digit display such as "H*" or "L*" on the value LED 17. The switching of the upper and lower limit inputs is done every time the width switch 32 is operated.

When the touch switch 33 is operated, the upper and lower limits of the key touch to which the sound is allotted are determined by operating the fine switches 15*a* and 15*b* and coarse control 16. The input level is displayed as "H*" or "L*" on the value LED display 17. The switching of the upper and lower limit inputs is done every time the touch switch 33 is operated.

The MIDI section on the panel 1 includes a PLAY switch 34. When the play switch 34 is operated, its inner LED 34-1 is turned on, and performance is done according to keyboard signal, touch data, etc., that are externally coupled through the MIDI IN terminal 35.

When a check (CHECK) switch 36 is operated, a tone displayed on the tone LED 13 is automatically sounded, so that it is possible to know by hearing the way in which the sound is coupled and stored. The operating state is displayed on a LED 36-1.

When the play switch 34 is operated or when the check switch 36 is operated, an output note signalis fed from output terminal 37 through an amplifier and a loudspeaker in the external sounding system.

The operating switch panel section 1, as shown in FIG. 1, is connected to a CPU 38 via a bus line ABUS. The CPU 38 consists of a microprocessor which performs various process controls as will be described later.

The CPU 38 is connected to a work memory 39, which has memory areas used for various process controls, via a bus line BBUS. The CPU 38 is connected to a waveform R/W controller 40 (40-0 to 40-3) having a four-channel structure (CH0 to CH3) via a bus line CBUS. The waveform R/W controller sections 40-0 to 40-3 for the respective four channels may each have independent hardware. Alternatively, the section 40 may operate for the four channels on a time division basis.

The waveform R/W controller sections 40-0 to 40-3 for the four channels supply address signals (ADDRESS) to a record memory 41 via a bus line DBUS on a time division basis, and transfer of data (DATA) between the sections 40-0 to 40-3 and record memory 41 is done via a bus line EBUS. Further, the sections 40-0 to 40-3 provide read/write signals (R/W) to the record memory 41 on a time division basis.

Thus, the waveform R/W controller sections 40-0 to 40-3 may access waveform data in an identical area of in different areas in the record memory 41 by providing different address signals thereto. Further, it is possible to read out waveform data in a channel while writing waveform data in a different channel.

The record memory 41 has a memory capacity of 1.5 megabits, for instance, and can be divided into 32 blocks for recording waveform signal digitally, e.g., by PCM recording. The tone map LED display 14 shown in FIG. 2 has 16 LED elements, so one LED element corresponds to two blocks.

Referring to FIG. 1, external sound signal coupled through the microphone terminal 3 of the operating switch panel section 1 is sampled to be fed to an A/D converter 42. The A/D converter 42 converts the input signal into a PCM digital signal which is fed to the waveform R/W controller sections 40-0 to 40-3 (actually the waveform R/W controller sections 40-0 and 40-1 corresponding to the channels CH0 and CH1) to be stored in a suitable address area of the record memory 41.

A digital signal read out from the record memory 41 by the waveform W/R controller sections 40-0 to 40-3 is fed on a time division basis to a D/A converter 43 for conversion into an analog signal which is fed to sample-and-hold (S & H) circuits 44-0 to 44-3. The S & H circuits 44-0 to 44-3 sample and hold waveform signal on a time division basis and for each channel.

The outputs of the S & H circuits 44-0 to 44-3 are fed to respective VCAs (voltage controlled amplifiers) 45-0 to 45-3 for amplitude envelope control before being fed to a mixing circuit 46. The VCAs 45-0 to 45-3 perform envelope control of the outputs of the S & H circuits 44-1 to 44-3 according to a voltage signal obtained through conversion of an envelope control signal from the CPU 38 through D/A converters 47. The D/A converters 47 are provided for the respective VCAs 45-0 to 45-3.

The output signal of the mixing circuit 46 is provided from the output terminal 37 of the operating switch panel section 1 to be fed to a sounding system including a loudspeaker (not shown).

The operation of the embodiment will now be described. First, the operation will be described in connection with a record mode, in which external sound waveform is stored in the record memory 41.

Record mode

The microphone plug is inserted into the MIC IN terminal 3 to be ready for coupling external sound signals, and then the record switch 8 is operated to be ready for recording. In the ready-to-record state, an external sound signal is repeatedly recorded in the last block (i.e., an area from (D) to (E) shown in FIG. 3) of the record memory 41. Actually, the external sound signal is recorded until a trigger signal is impressed. The area from (D) to (E) will be referred to as a delay trigger area. In the record mode, the LED 8-1 is "on".

With the impression of the trigger signal in this state, the recording is actually started. There are three trigger systems. In one of these systems, a trigger signal is generated when the external sound signal exceeds a reference level preset by the trigger level control 6. This system is referred to as auto-trigger system. A second trigger system is based on a trigger signal which is externally coupled through the TRIG IN terminal 4. In a third trigger system, a trigger signal is generated when the TRIG switch 10 is operated by the operator. The second system is referred to as external trigger system, and the third system is referred to as manual trigger system. The trigger level control 6 is provided with a range, in which the auto-trigger is not effected, that is, when the control 6 is in such a range, either second or third trigger system can be employed.

When a trigger signal is generated on the basis of either one of the three trigger systems, the LED 10-1 is turned on.

Figure 4:
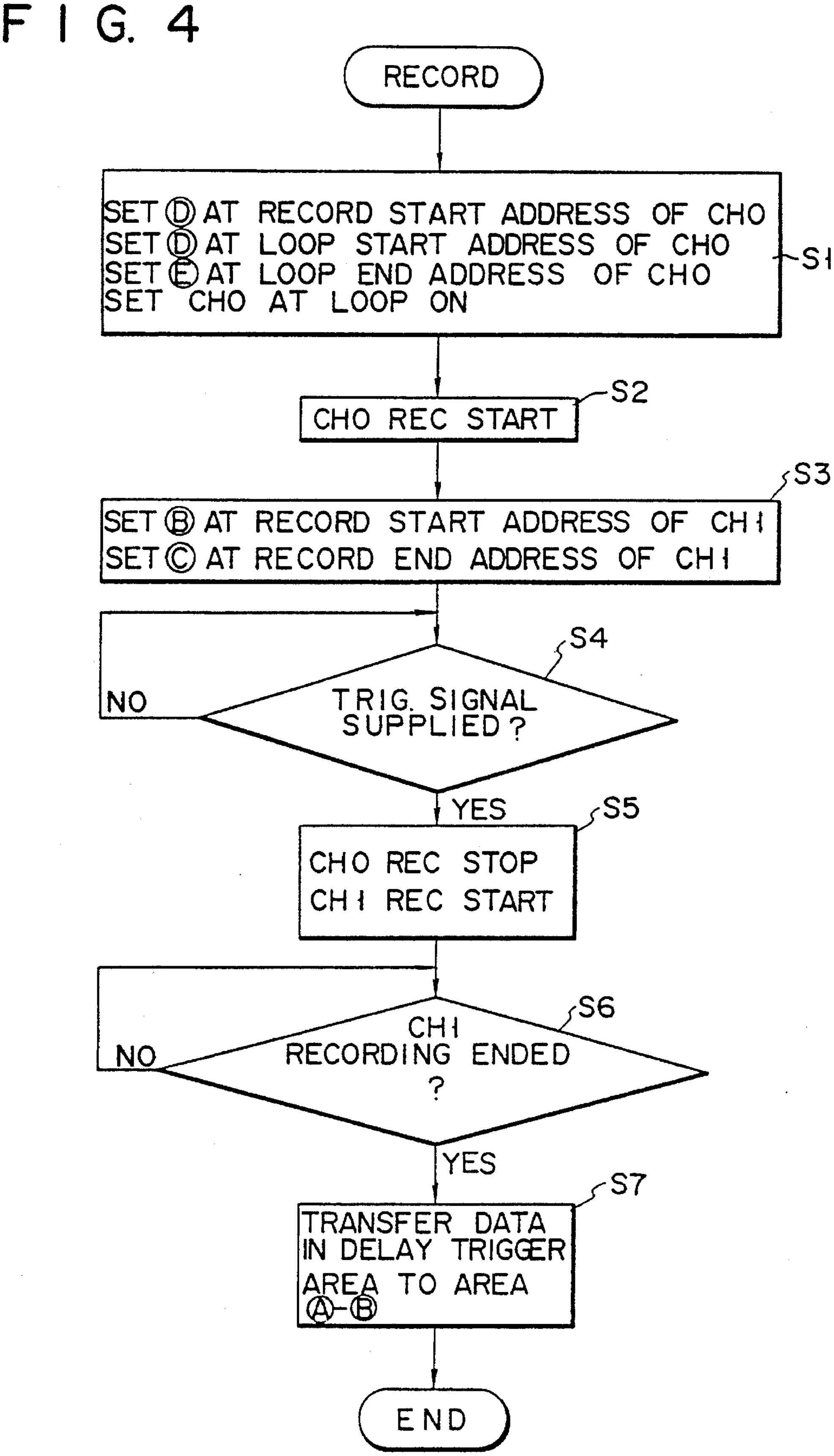
FIG. 4 is a flow chart for explaining the operation of the embodiment shown in FIG. 1 in a record mode.

The operation of the CPU 38 in the record mode will now be described with reference to FIG. 4.

Figure 3:
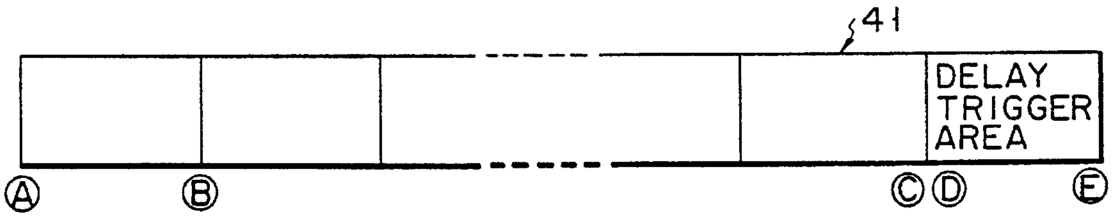
FIG. 3 is a schematic view showing memory areas and addresses of a memory for storing sound data in the embodiment shown in FIG. 1.

When the REC switch 8 is operated, a step S1 is executed, in which the CPU 38 sets address (D) shown in FIG. 3 as record start address in the waveform R/W controller section 44-0 for channel CH0, sets address (D) as loop start address for channel CH0, sets address (E) as loop end address for channel CH0 and sets loop on for CH0. In this state, the waveform R/W controller section 44-0 (or any of the other waveform R/W controller sections 44-1 to 44-3 in case of any of the other channels) can repeatedly execute reading or writing with respect to a particular address area in a record memory, and it repeatedly designates addresses from the loop start address to the loop end address in the loop-on state.

Figure 5:
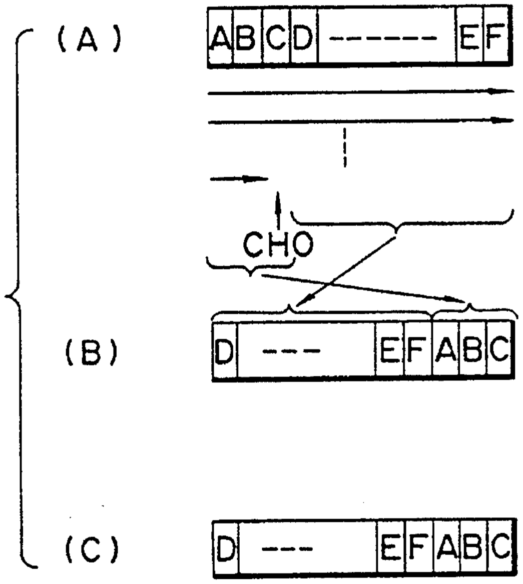
FIG. 5 is a view for explaining an operation of rearranging data recorded in a delay trigger area of the memory shown in FIG. 1.

In a subsequent step S2, the CPU 38 provides, via the bus line CBUS, a command to the waveform R/W controller section 44-0 for channel CH0 to start recording. Thus, external sound signal coupled through the MIC IN terminal 3 is successively sampled and converted in the A/D converter 42 into a PCM digital signal which is written in the record memory 41. FIG. 5A shows the manner in which the external sound signal is recorded. The signal is repeatedly recorded in the delay trigger area (i.e., area from address (D) till address (E)). When signal is repeatedly recorded in the area, the previously recorded signal is erased, and only the newest input signal is recorded. For example, an external sound signal at 100 msec. is recorded in the delay trigger area. With the external sound signal preiminarily recorded in the delay trigger area in this way, natural rising of record can be subsequently obtained.

In a subsequent step S3, the CPU 38 sets address (B) shown in FIG. 3 as record start address in the waveform R/W controller section 40-1 for channel CH1, and also sets address (C) as record end address for channel CH1. The record start address and record end address are of course variable.

In a subsequent step S4, the CPU 38 effects a check as to whether a trigger signal is supplied by one of the systems noted above, i.e., auto-trigger system, external trigger system and manual trigger system. If the decision of the check is "No", the step S4 is executed repeatedly. If the decision is "Yes", i.e., if the trigger signal is supplied, a step S5 is executed.

In the step S5, recording with respect to the waveform R/W controller section 40-0 for channel CH0 is stopped. For example, the address designation is stopped at a position shown at CH0 in FIG. 5A.

The CPU 38 then supplies a command through the bus line CBUS to start recording .with respect to the waveform R/W controller section 40-1 for channel CH1. In the instant case, the recording is started again from address (B) in FIG. 3. The routine then goes to a step S6, in which the CPU 38 makes a check as to whether the address designation by the waveform R/W controller section 40-1 has been done up to a position (C) shown in FIG. 3. If the decision of the check is "No", the step S6 is repeatedly executed. When the last address is reached, a decision "Yes" is yielded, so that the routine proceeds to a step S7.

In the step S7, the data in the delay trigger area is transferred to a predetermined area in the work memory 39, as shown in FIG. 5B. Since in this case the data in the area (D) to (F) in FIG. 5B has been recorded prior to the data in the area (A) to (C), the data in the area (D) to (F) is transferred prior to the data in the area (A) to (C), thus changing the sequence of data to the one shown in FIG. 5C. The data in this sequence is then recorded in the first block, area (A) to (B), of the record memory 41. Thus, the external sound signal is digitally recorded in the area (A) to (C) of the record memory 41.

To cut away unnecessary portion of the data thus recorded, the cut switch 11 is operated, and with the LED 11-1 "on" the fine switches 15*a* and 15*b* and coarse control 16 are operated. At this time, the position and length of the stored tone data are displayed on the tone map LED display 14, and every time a cut operation is executed the display of the memory area is changed.

While in the above case a signal of a single tone is stored in the record memory 41, it is possible to continually store different tones by switching the tone number by operating the TONE SET switch 12.

Figure 6:
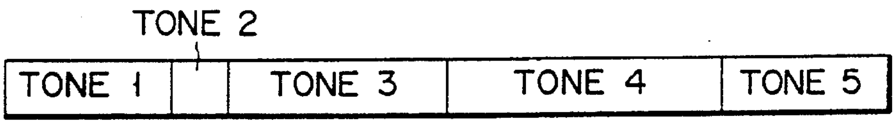
FIG. 6 is a view showing a plurality of different tone data stored in the memory shown in FIG. 1.

In this case, the CPU 38 causes the waveform R/W controller sections 40-0 to 40-1 to suitably designate the record start address and record end address for recording. FIG. 6 shows stored waveform data of tones 1 to 5. Every time the TONE SET switch 12 is operated, the tone number is changed and digitally displayed on the tone LED display 13, and the memory area of the pertinent tone is displayed on the tone map LED display 14.

When the clear switch 9 is operated, the number displayed on the tone LED display 13 and waveform data of tones of the subsequent tone numbers are erased. By operating the clear switch 9 while "3" is displayed on the tone LED 13, the tones 3 to 5 are erased from the record memory 41 to be ready for recording of new external sound signal.

The signal recorded in the above way is read out as the CPU 38 commands the waveform R/W controller section 40-0 to make successive memory address accesses and is converted through the D/A converter 43 into an analog signal to be amplified through the VCA 45-0 and provided through the output terminal 37 for sounding. It is thus possible to check the status of recording.

Edit wave mode

Now, an operation of producing a waveform signal for an actual tone signal by variously modifying the stored waveform signal will be described.

Figure 7:
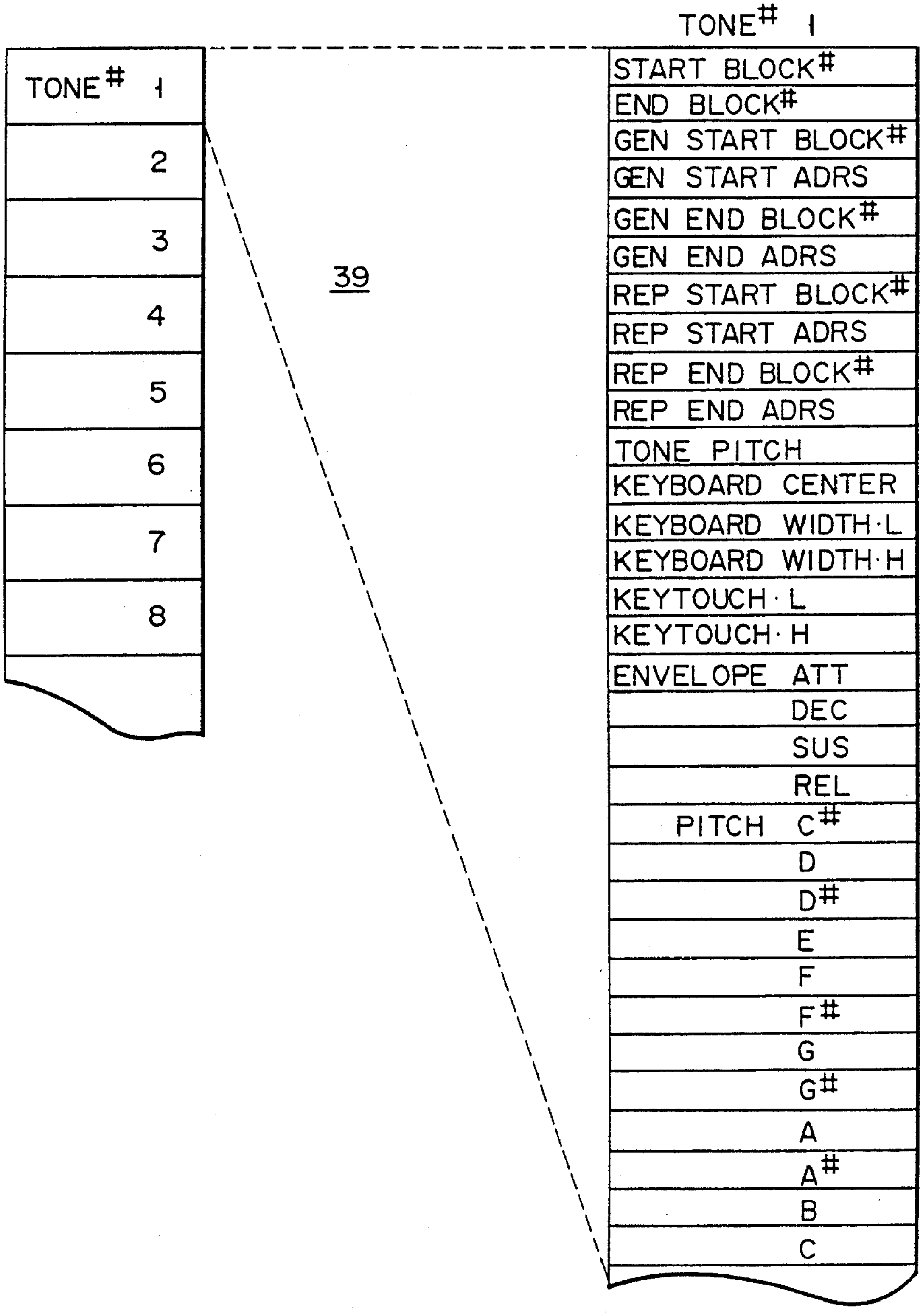
FIG. 7 is a view showing part of data stored in a work memory shown in FIG. 1.

FIG. 7 shows data recorded in .a particular address area of the work memory 39, the recorded data concerning the external sound signal stored in the record memory 41.

The data is recorded in the order of the tone number. For example, the following data is stored in the tone 1 area of the work memory 39 under the control of the CPU 38.

Start block number (START BLOCK #) designates the first block of the memory 41 where the begining part of the waveform data of tone 1 is stored, and end block number (END BLOCK #) designates the last block where the end part of the waveform data of tone 1 is stored. The display on the tone map LED display 14 is based on these two data.

Figure 8:
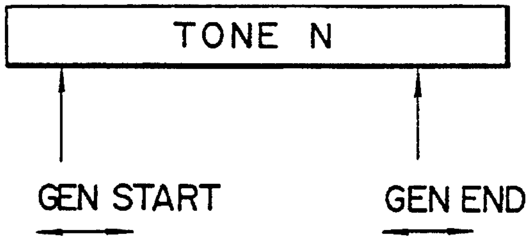
FIG. 8 is a view for explaining alteration of general start and end addresses in a memory area.

The next data, i.e., general start block number (GEN START BLOCK #) designates the block address with which to start the actual sounding. The next general start address (GEN START ADRS) designates a lower address in the block. This value is set after the operation of the general start switch 20 using the fine switches 15*a* and 15*b* and coarse control 16. FIG. 8 shows an example of the general start and end positions.

General end block number (GEN END BLOCK #) and general end address (GEN END ADRS) are set as next data by operating the general end switch 21 and then the fine switches 15*a* and 15*b* and coarse control 16. FIG. 8 shows it is possible to freely set the general end position in this way.

Repeat start block number (REP START BLOCK #) and repeat start address (REP START ADRS) are set in the next area by operating the repeat start switch 22 and then fine switches 15*a* and 15*b* and coarse control 16. These data designate the start position when repeatedly accessing a particular area where waveform data is stored. It is possible to set any desired general start position in the area of tone N. Likewise, repeat end block number (REP END CLOCK #) and repeat end address (REP END ADRS) are set by operating the repeat end switch 23 and then the fine switches 15*a* and 15*b* and coarse control 16. These data designate the end address of a particular area of waveform data.

Figure 9:
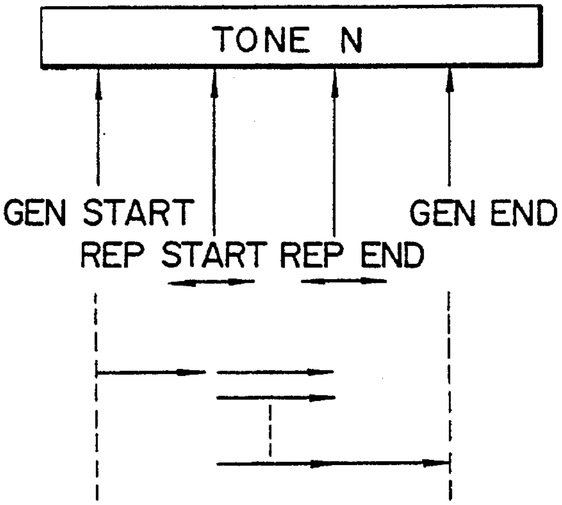
FIG. 9 is a view for explaining alteration of repeat start and end addresses in a memory area and an address designation sequence at the time of play.

FIG. 9 shows this state. The waveform R/W controller sections 40-0 to 40-3 access waveform data from the general start (GEN START) address till the repeat start address in the actual play. Then they repeatedly access waveform data from the repeat start address till the repeat end address for a predetermined number of times, and then access waveform data from the repeat end address till the general end address. It may be made such that the repeat end address is passed at the instant of the turn-off operation of a performance key on the keyboard. The operation of setting the general and repeat start and end addresses will be described later in further detail.

Tone pitch (TONE PITCH) data stored in the work memory 39 in FIG. 7 is set by operating the TONE PITCH switch 19 and then the fine switches 15*a* and 15*b* and coarse control 16. Twelve note frequency data (PITCH C# to PITCH C) of a particular octave as shown in FIG. 7, are determined to reflect the preset data noted above and data preset by operating the MASTER TUNE switch 18.

Keyboard center (KEYBOARD CENTER) is set in the work memory 39 by operating the keyboard center switch 31 and then the fine switches 15*a* and 15*b* and coarse control 16. In effect, a correspondence of the recorded external sound signal to a note is determined. The correspondence is digitally displayed on the value LED display 17. The setting of the keyboard center has a function of transposing the data C# to C.

More specifically, when the frequency of the external sound signal is fl, the note designated by the keyboard center has this frequency f1, and the frequency f1 may be made to correspond to a different note by changing the keyboard center.

The frequency of each note is set through renewal of the contents of the pitches C# to C in FIG. 7 with the setting of the keyboard center or varying the correspondence of the frequency to the note when actually reading out the data.

Subsequent contents of KEYBOARD WIDTH LOW (L) and KEYBOARD WIDTH HIGH (H) are set by operating the keyboard width switch 32 and then fine switches 15*a* and 15*b* and coarse control 16. In this way, the tone width is set for the pertinent tone. The setting of the keyboard center and keyboard width low and high may also be done by operating performance keys on the keyboard connected to the MIDI IN terminal 35.

Subsequent contents of KEY TOUCH LOW (L) and KEY TOUCH HIGH (H) are set by operating the key touch switch 33 and fine switches 15*a* and 15*b* and coarse control 16. The pertinent tone range thus is set according to the key touch (key depression speed). The upper and lower limits of the key touch are displayed on the value LED display 17.

Further, data of attack (ATT), decay (DEC), sustain (SUS) and release (REL) of the envelope is set in the work memory 39 by operating the envelope attack, decay, sustain and release switches 27 to 30, respectively, and then the fine switches 15*a* and 15*b* and coarse control 16.

Further, data of vibrato. etc. are stored in the tone 1 memory area, the description of which however, is omitted.

Figure 10:
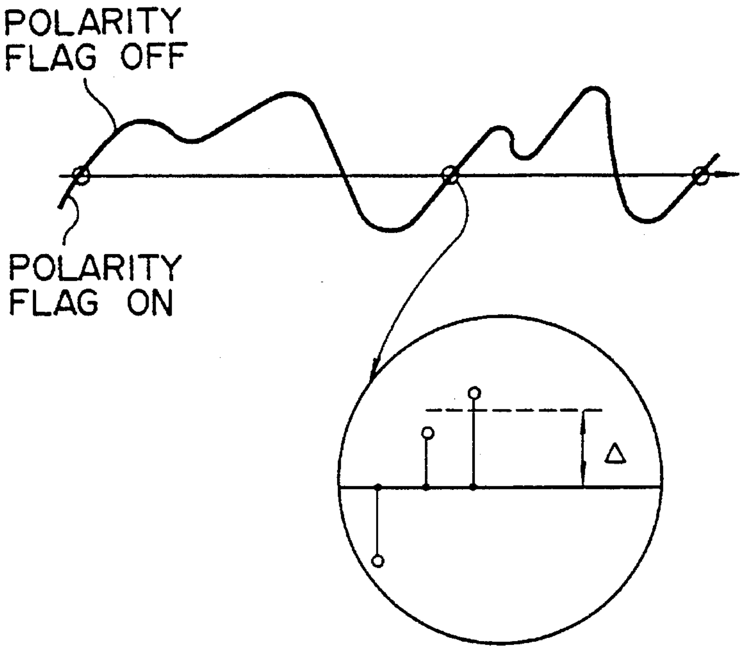
FIG. 10 is a graph for explaining zero crossing points of a waveform stored in a memory.

The operation of detecting the general start or end address or repeat start or end address noted above will now be described in detail. The level of waveform data changes with time as shown in FIG. 10, and if the start or end of waveform is designated as a point other than a zero crossing point of the waveform, noise called click is provided. Therefore, it is necessary to detect a zero crossing point, at which the waveform crosses the zero level, and make the address of that point to be a general start or end address or repeat start or end address.

Figure 11:
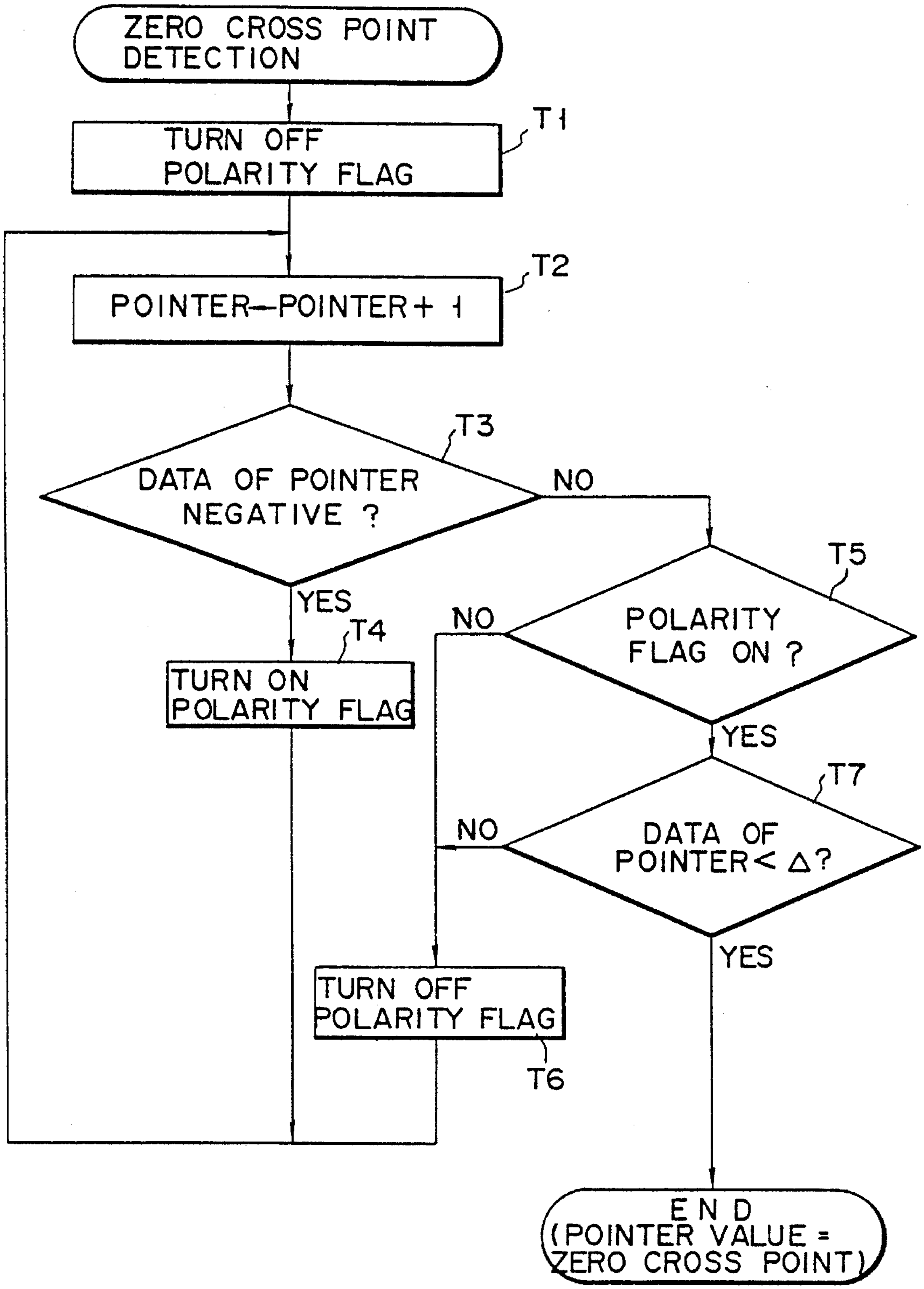
FIG. 11 is a flow chart illustrating an operation of zero crossing point detection in the embodiment shown in FIG. 1.

FIG. 11 shows the relevant operation. The CPU 38 reads out waveform from the record memory 41 for detection of zero crossing point according to the operation of the fine switches 15*a* and 15*b* and coarse control 16.

FIG. 11 shows a routine that is executed when the waveform data is changed from negative to positive. In a step T1, a polarity flag is turned off. In a subsequent step T2, a pointer in the CPU 38 (which designates an address of the record memory 41 and is varied in synchronism to an address counter in the waveform R/W controller section 40-0) is incremented.

In a subsequent step T3, a check is done as to whether the waveform data at the address shown by the pointer is negative. . If the decision of the check is "Yes", a step T4 is executed, in which the polarity flag is turned on. The polarity flag is turned on when the amplitude value of the waveform is negative and turned off when the amplitude value is positive.

Subsequent to the step T4, the routine goes back to the step T2 to repeat the operation noted above. When the waveform data of the address shown by the pointer becomes positive, the decision of the check in the step T3 becomes "No". The routine thus proceeds to a step T5, in which a check is done as to whether the polarity flag is "on".

If the polarity flag is "off", i.e., positive amplitude values are being continuously read out, the decision of the check of the step T5 is "No". The routine then goes back to a step T6, in which the polarity flag is turned off.

The step T5 yields a decision "Yes" if the amplitude value of pointer has been negative in the previous check and is positive in the check of this time, i.e., just when a waveform data is passed at a zero crossing point. In this case, a step T7 is executed subsequent to the step T5. In the step T7, a check is done as to whether the amplitude data of this time is less than a predetermined value Δ as shown in FIG. 10. More specifically, the step S5 yields a decision "Yes" in the neighborhood of a zero crossing point of the waveform as shown in FIG. 10, but a click noise will occur unless the data at that address point is actually small, i.e., smaller than the predetermined value Δ. In such a case, the zero crossing point detection process becomes meaningless. Therefore, if a decision "NO" is yielded in the step T7, the steps T1 through T6 are executed repeatedly until the next zero crossing point. If a decision "Yes" is yielded in the step T7, the routine is ended with the writing of the prevailing pointer value as the general start or end address or repeat start or end address in the work memory 39 by the CPU 38.

While FIG. 11 shows the routine of the CPU 38 in case when the waveform data changes from negative to positive, in case when the waveform data becomes from positive to negative, the polarity flag is turned on in a step T1' corresponding to the step T1, a check as to whether the pointer data is positive is done in a step T3' corresponding to the step T3, the polarity flag is turned off in a step T4' corresponding to the step T4, the polarity flag is turned off in a step T5' corresponding to the step T5, the polarity flag is turned on in a step T6' corresponding to the step T6, and similar operations are executed to those of the other steps T2 and T7. In this case, the absolute value of the waveform data is compared with the value Δ in the step T7.

Play mode

Now, the operation will be described in connection with a play mode, which is set up by operating the play switch 34 and in which music is played according to a signal coupled through the MIDI IN terminal 35.

Figure 12:
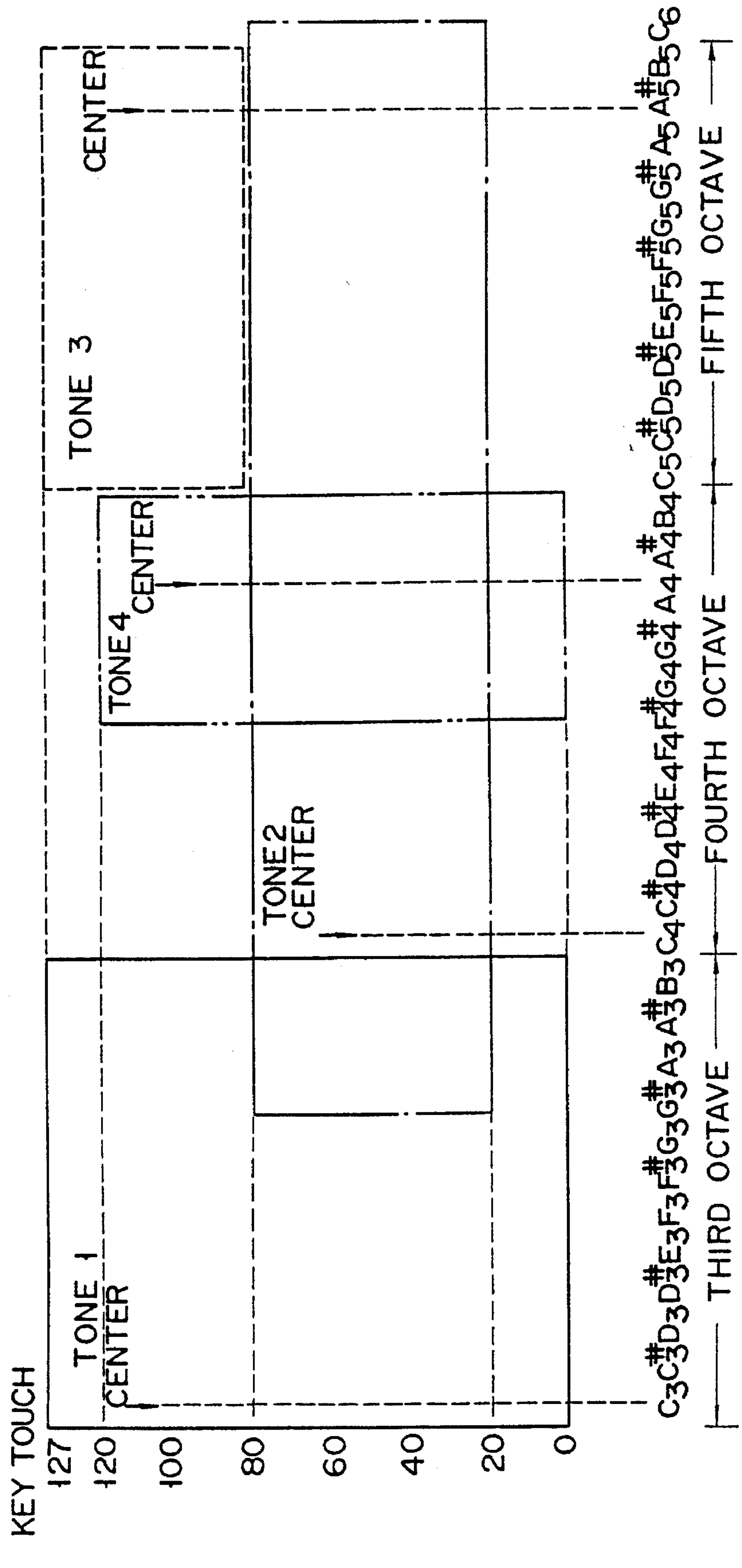
FIG. 12 is a view illustrating the relation between a plurality of different tone data and ranges thereof on a keyboard.

It is assumed that different waveform data of tones 1 to 4 are stored in the record memory 41, and data of keyboard center, keyboard width low and high and key touch low and high as shown in FIG. 12 are stored in the work memory 39.

FIG. 12 schematically shows data of tones 1 to 4. Of the tone 1, the keyboard center is $C_3$ (the suffix figure representing the octave number), the keyboard width is $C_3$ to $B_3$, and the key touch is 0 to 127.

Of the tone 2, the keyboard center is $C_4$, the keyboard width is $G_3$# to $C_6$, the key touch is 20 to 80. Of the tone 3, the keyboard center is $A_5$#, the keyboard width is $C_5$ to $B_5$, and the key touch is 81 to 127. Of the tone 4, the keyboard center is $A_4$, the keyboard width is $F_4$# to $B_4$, and the key touch is 0 to 120.

Figure 13:
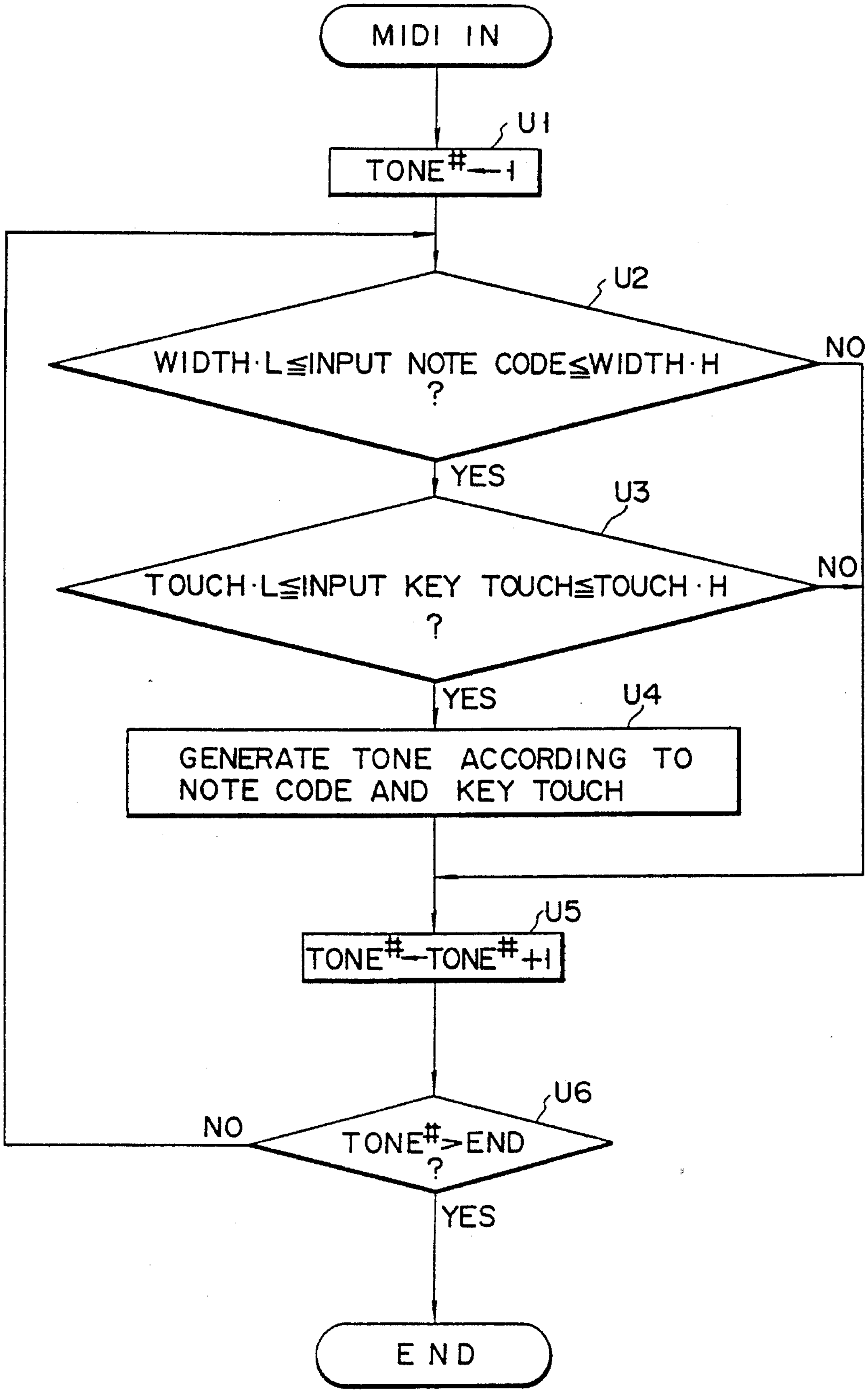
FIG. 13 is a flow chart for explaining the operation of the embodiment shown in FIG. 1 in a play mode.

FIG. 13 shows a routine of the CPU 38 in this operation. In a step U1, the CPU 38 sets "1" in a flag register for designating the tone number (TONE #). The register is hereinafter referred to as tone number register. In a subsequent step U2, a check is done as to whether the tone code (i.e., a second parameter) coupled through the MIDI IN terminal 35 is in a range specified by the keyboard width low and high of the tone 1 area of the work memory 39.

If the decision of the check in the step U2 is "Yes", the routine goes to a step U3. In the step U3, a check is done as to whether the key touch data (i.e., a second parameter) coupled through the MIDI IN terminal 35 is in a range of key touch low and high of the tone 1 area of the work memory 39.

If the decision of the check in the step U3 is "Yes", the routine goes to a step U4, in which the tone designated by the tone number register (in the instant case tone 1) is generated according to the note code and key touch data (i.e., the first and second parameters, respectively).

More specifically, the CPU 38 supplies data designating the general start and end positions and repeat start and end positions from the pertinent area of the work memory 39 to one of the waveform R/W controller sections 40-0 to 40-3 that is out of use. The CPU 38 also converts the pitch data corresponding to the note code to be read out from the work memory 39 and be converted into octave data which is supplied to the waveform R/W controller section 40 for the designated channel.

As a result, the relevant waveform R/W controller section reads out the waveform data in the designated area of the record memory 41 at a rate corresponding to the pitch data and feeds the read-out data to the D/A converter 43.

The analog waveform signal provided from the D/A converter 43, is fed through a corresponding one of the S & H circuits 44-0 to 44-3 and then through a corresponding one of the VCAs 45-0 to 45-3. Digital data which is varying according to the envelope attack, decay, sustain and release data read out from the work memory 39 and input key touch data, is fed, after conversion in a corresponding one of the four D/A converters 47, to an analog voltage signal, to the VCA. The VCA thus effects sound volume control according to the key touch while also providing a preset envelope.

The output signal is fed through the mixing circuit 46 and output terminal 37 to the outside.

In the step U4 as shown in FIG. 13, the channel for tone generation as well as the given note and key touch are designated in this way, and the routine then goes to a step U5. The step U5 is also executed if a decision "No" yields in the step U2 or U3.

In the step U5, the content of the tone number register is incremented. Subsequent to this step, a step U6 is executed, in which a check is done as to whether the steps U2 through U5 have been completed for the tones 1 to 4. If the decision is "No", the routine goes back to the step U2. If a decision "Yes" is yielded in the step U6, the process on the data coupled through the MIDI IN terminal 35 is completed. Thus, when a plurality of keys are operated simultaneously on the keyboard, the CPU 38 executes the routine shown in FIG. 13 to allot tones to the waveform R/W controller sections 40-0 to 40-3 for different channels CH0 to CH3. Further, when a stop command is given to the MIDI IN terminal 35 with a key "off" operation, the sounding is stopped through a similar process.

As examples shown in FIG. 12, if the data coupled through the MIDI IN terminal 35 is $C_3$ and the key touch is 40, the tone 1 is sounded at the level of the key touch 40. If the data coupled through the MIDI IN terminal 35 is $A_3$ and the key touch is 40, the tones 1 and 2 are sounded at the level of the key touch 40.

If the data coupled through the MIDI IN terminal 35 is $C_5$ and the key touch is 100, the tone 3 is sounded. If the same data is coupled and the key touch is 60, the tone 2 is sounded.

In the above embodiment, a plurality of waveform signals that have been recorded in advance can be selectively used according to the keyboard range and key touch range. Thus, it is possible to enrich the prior art keyboard split function, and also it is possible to readily permit switching of timbres according to the key touch.

Effectiveness of the Invention

As has been described in the foregoing, addresses designating the start and end of reading of waveform data from the record memory are set such that a zero crossing point is automatically detected and the reading is started or ended at the detected substantially zero crossing point, so that it is possible to eliminate the click noise or the like.

Further, according to the invention the externally supplied sound signal is stored in the record memory such that the pitch of the sound signal corresponds to a desired note, and a transposition can be readily obtained by changing the correspondence relation.

Further, according to the invention a plurality of waveform data stored in the record memory are selectively accessed depending on whether input parameter such as the note or key touch is in a designated range. Thus, it is possible to provide a novel status of play.

Further, according to the invention the status of use of the record memory can be readily recognized by sight from a display, on which the ranges of a plurality of digitally recorded waveform signals are displayed.

What is claimed is:

1. A sampling method comprising:

converting a waveform signal into a digital signal representing the waveform signal;

recording said digital signal representing the waveform signal in a record memory means;

visually displaying a memory state of said record memory means on a display means, the visual display including a visual indication corresponding to the stored digital signal, so that a user can see the memory state of said record memory means by observing said display means;

manually designating a portion of the digital signal stored in said record memory means while a user sees the memory state of said record memory means by observing said display means; and deleting a portion of the digital signal, designated in said manually designating step, from the record memory means.

2. The sampling method according to claim 1, wherein:

said recording step comprises recording said digital signal in at least one of a plurality of memory blocks in said record memory means; and said display means includes a plurality of visually observable display elements corresponding to said respective memory blocks for displaying the memory state of said record memory means.

3. The sampling method according to claim 2, wherein said manually designating step includes manually designating a memory block so as to delete a corresponding digital signal stored in said designated memory block of said record memory means.

4. The sampling method according to claim 1, further comprising reading out the digital signal from said record memory means at a rate corresponding to a note frequency.

5. A sampling apparatus comprising:

converting means for converting a waveform signal into a digital signal representing the waveform signal;

record memory means for recording said digital signal representing the waveform signal;

display means for visually displaying a memory state of said record memory means., including a visual indication corresponding to the stored digital signal, so that a user can see the memory state of said record memory means by observing said display means;

designating means for manually designating a portion of the digital signal stored in said record memory means while a user can see the memory state of said record memory means by observing said display means; and deleting means for deleting the portion of the digital signal designated by said designating means from the record memory means.

6. The sampling apparatus according to claim 5, wherein:

said record memory means includes a plurality of memory blocks for storing digital information corresponding to a digital signal stored in said record memory means; and said display means includes a plurality of visually observable display elements corresponding to said respective memory blocks for displaying the memory state of said record memory means.

7. The sampling apparatus according to claim 6, wherein said designating means includes means for manually designating a memory block so as to delete the digital information stored in said designated memory block of said record memory means.

8. The sampling apparatus according to claim 5, further comprising reading means for reading out the digital signal from said record memory means at a rate corresponding to a note frequency.

* * * * *